United States Patent [19]

Inoue et al.

[11] Patent Number: 5,486,705
[45] Date of Patent: Jan. 23, 1996

[54] HETEROJUNCTION FIELD EFFECT TRANSISTOR

[75] Inventors: Kaoru Inoue, Kadoma; Toshinobu Matsuno, Katano; Tadayosi Nakatuka, Osaka; Hiroyuki Masato, Kadoma, all of Japan

[73] Assignee: Matsushita Electric Industrial Co., Ltd., Japan

[21] Appl. No.: 257,125

[22] Filed: Jun. 9, 1994

[30] Foreign Application Priority Data

Jun. 15, 1993 [JP] Japan .................................. 5-143442

[51] Int. Cl.$^6$ .................................................. H01L 29/06
[52] U.S. Cl. ............................ 257/24; 257/190; 257/194
[58] Field of Search ........................... 257/194, 24, 192, 257/27, 23, 25, 97, 190; 372/45

[56] References Cited

U.S. PATENT DOCUMENTS

| | | | |
|---|---|---|---|
| 5,038,187 | 8/1991 | Zhou | 257/194 |
| 5,175,740 | 12/1992 | Elman et al. | 372/45 |
| 5,253,263 | 10/1993 | Jansen et al. | 372/45 |
| 5,258,632 | 11/1993 | Sawada | 257/194 |
| 5,263,040 | 11/1993 | Hayakawa | 257/18 |
| 5,298,762 | 3/1994 | Ou | 257/13 |
| 5,404,032 | 4/1995 | Sawada et al. | 257/192 |

FOREIGN PATENT DOCUMENTS

| | | | |
|---|---|---|---|
| 63-161678 | 7/1988 | Japan | 257/24 |
| 1-128473 | 5/1989 | Japan | 257/24 |
| 3-11767 | 1/1991 | Japan | 257/24 |

OTHER PUBLICATIONS

Zipperian et al., "A GaAs/In$_{0.25}$Ga$_{0.75}$As/GaAs modulation–doped, single, strained quantum well FET", Inst. Phys. Conf. Ser. No. 79, Ch. 8, 1986, pp. 421–425.

Küsters et al., "Optimized Double Heterojunction Pseudomorphic InP/In$_x$Ga$_{1-x}$As/InP (0.64$\geq$x$\geq$0.82) p–MODFET's and the Role of Strain in Their Design", IEEE Transactions on Electron Devices, vol. 40, No. 12, Dec. 1993, pp. 2164–2170.

*Primary Examiner*—Sara W. Crane
*Assistant Examiner*—Courtney A. Bowers
*Attorney, Agent, or Firm*—Parkhurst, Wendel & Rossi

[57] ABSTRACT

A heterojunction FET comprises: a semi-insulation GaAs substrate; and a heterojunction structure, formed on the substrate, having: an active layer including: an undoped InGaAs layer including 10–254 of InAs composition; an undoped GaAs layer formed on the undoped InGaAs layer on the opposite side of the substrate; first and second AlGaAs layers doped with first and second dopants respectively, sandwiching the active layer, the second AlGaAs layer being provided between said active layer and the substrate; and source, gate, and drain electrodes on the heterojunction structure. A first density of the first dopant may be lower than a second density of the second dopant. The first and second dopant may be p or n type. The AlAs composition of the first AlGaAs layer may be lower than that of the second AlGaAs layer. First and second undoped AlGaAs layers sandwiched between the active layer and the first AlGaAs layer and sandwiched between the active layer and the second AlGaAs layer respectively may be provided. The second undoped AlGaAs layer is formed on the side of the substrate. The first and second undoped AlGaAs layers have first and second thicknesses respectively, the first thickness being larger than the second thickness.

26 Claims, 3 Drawing Sheets

- 11 SOURCE ELECTRODE
- 12 GATE ELECTRODE
- 13 DRAIN ELECTRODE
- 10 n$^+$-GaAs LAYER
- 9 n-Al$_z$Ga$_{1-z}$As LAYER
- 8 UNDOPED Al$_z$Ga$_{1-z}$As LAYER
- 7 UNDOPED GaAs LAYER
- 6 UNDOPED In$_y$Ga$_{1-y}$As LAYER
- 5 UNDOPED Al$_x$Ga$_{1-x}$As LAYER
- 4 n-Al$_x$Ga$_{1-x}$As LAYER
- 3 UNDOPED Al$_x$Ga$_{1-x}$As LAYER
- 2 UNDOPED GaAs BUFFER LAYER
- 1 SEMI-INSULATING GaAs SUBSTRATE

HETEROJUNCTION FIELD EFFECT TRANSISTOR

BACKGROUND OF THE INVENTION

1. Field of the Invention

This invention relates to a heterojunction field effect transistor.

2. Description of the Prior Art

A double heterojunction FET (field effect transistor), frequently used in an amplifier for high frequency communication, having a double heterojunction structure is known. FIG. 3 is a cross-sectional view of an example of such a prior art double heterojunction FET. FIG. 2 shows gate voltage depending characteristics (gm-Vgs characteristic) with respect to a mutual conductance of the prior art double heterojunction FET shown in FIG. 3 together with heterojunction FET of this invention. This double heterojunction FET comprises a double heterojunction structure including two n-type AlGaAs layers 104 and 108 and a GaAs quantum well layer 106 sandwiched between the n-type AlGaAs layers 104 and 108. Because the GaAs quantum well layer 106 is supplied with electrons from both n-type AlGaAs layers 104 and 108, a density of electrons stored in the GaAs quantum well layer 106 is about twice that in the conventional single heterojunction structure. Moreover, a spreading area of electrons is adjustable by changing the thickness of the GaAs quantum well layer 106, so that if an appropriate thickness of the GaAs quantum well layer 106 is set, it is possible to obtain a relation between a mutual conductance and the gate voltage as shown by a curve "d" in FIG. 2 wherein the mutual conductance can be maintained to a high level over a relatively wide gate voltage range. The smaller the change in the mutual conductance around the operation point, the smaller the second order and third order distortion characteristics. Therefore, the double heterojunction structure is improved in the distortion characteristic compared with the case of the conventional single heterojunction structure when the operation point is set around the maximum value of the mutual conductance.

However, in the case of the double heterojunction structure, a decrease in the mutual conductance at a high gate voltage (a positive gate voltage) region is large, so that there is a problem that the distortion characteristic becomes poor when a voltage of the input signal to the gate is large.

SUMMARY OF THE INVENTION

The present invention has been developed in order to remove the above-described drawbacks inherent to the conventional heterojunction field effect transistor.

According to the present invention there is provided a first heterojunction field effect transistor comprising: a semi-insulating GaAs substrate; and a heterojunction structure, formed on the semi-insulating GaAs substrate in a predetermined direction, having: an active layer including: an undoped InGaAs layer including 5% to 30% of InAs composition; and an undoped GaAs layer formed on the undoped InGaAs layer in the predetermined direction; and first and second AlGaAs layers, doped with first and second dopants respectively, sandwiching the active layer, the second AlGaAs layer being provided between the active layer and the semi-insulating GaAs substrate. The first and second dopants are of n or p type.

According to the present invention there is also provided a second heterojunction field effect transistor as mentioned in the first heterojunction field effect transistor, wherein a first density of the first n-dopant of the first AlGaAs layer is lower than a second density of the second n-dopant of the second AlGaAs. The first density may be 30 to 70% of the second density.

According to the present invention there is further provided a third heterojunction field effect transistor as described in the second heterojunction field effect transistor, wherein a first amount of first AlAs composition of the first AlGaAs layer is lower than a second amount of second AlAs composition of the second AlGaAs layer. The first amount may be 70% of the second amount.

According to the present invention there is also provided a fourth heterojunction field effect transistor comprising: a semi-insulating GaAs substrate; and a heterojunction structure, formed on the semi-insulating GaAs substrate in a predetermined direction, having: an active layer including: an undoped InGaAs layer including 5% to 30% of InAs composition; and an undoped GaAs layer formed on the undoped InGaAs layer in the predetermined direction; first and second undoped AlGaAs layers sandwiching the active layer, the second undoped AlGaAs layer being provided between the active layer and the semi-insulating GaAs substrate; and first and second AlGaAs layers, doped with first and second n-dopants respectively, sandwiching the first and second undoped AlGaAs layers and the active layer, the second AlGaAs layer being provided between the second undoped AlGaAs layer and the semi-insulating GaAs substrate.

According to the present invention there is further provided a fifth heterojunction field effect transistor as mentioned in the fourth heterojunction field effect transistor, wherein the first and undoped AlGaAs layer have first and second thicknesses respectively, the first thickness being larger than the second thickness. The first thickness may be 1.5 to 3.0 times the second thickness.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Prior to describing embodiments of this invention, the concept of this invention will be described. First, a channel layer of heterojunction FET comprises an undoped $In_yGa_{1-y}As$ mixed crystal layer, wherein y preferably ranges from 0.10 to 0.25 and an undoped GaAs layer formed on the undoped InGaAs. The value y may be 0.05 to 0.3, which is determined in consideration of preventing lattice defection. This channel layer is sandwiched between two AlGaAs electron supplying layers partially doped with n-impurity to form a heterojunction structure. This provides an operation as follows:

When a gate voltage causing an electron density exceeding the saturated electron density of the quantum wells of the InGaAs layer is applied, electrons are stored in the adjacent GaAs layer. However, a mobility and a speed of electrons are kept high because the GaAs layer is also undoped layer. Moreover, a potential energy of the GaAs layer is higher to an appropriate degree than the InGaAs layer, so that electrons are stored in the GaAs layer at a density considerably smaller than the electron density stored in the InGaAs layer. Therefore, though a high gate voltage is applied, the mutual conductance does not become high abnormally, so that the distortion characteristic is improved.

Second, the distortion characteristic is improved by increasing a density of n-impurity doped on one of the two AlGaAs layers formed on the InGaAs layer compared with a density of n-impurity doped on the other AlGaAs layer. This decreases the density of electron stored in the GaAs layer of the channel layer.

Third, the AlAs composition z in one of two $Al_zGa_{1-z}As$ electron supplying layers, formed on the GaAs layer is made smaller than the AlAs composition x of the other $Al_zGa_{1-z}As$ layer in contact with the InGaAs layer. For example, x=0.3 and z=0.15. This also decreases the density of electron stored in the GaAs layer of the channel layer.

Hereinbelow will be described a first embodiment of this invention.

Figure 1:
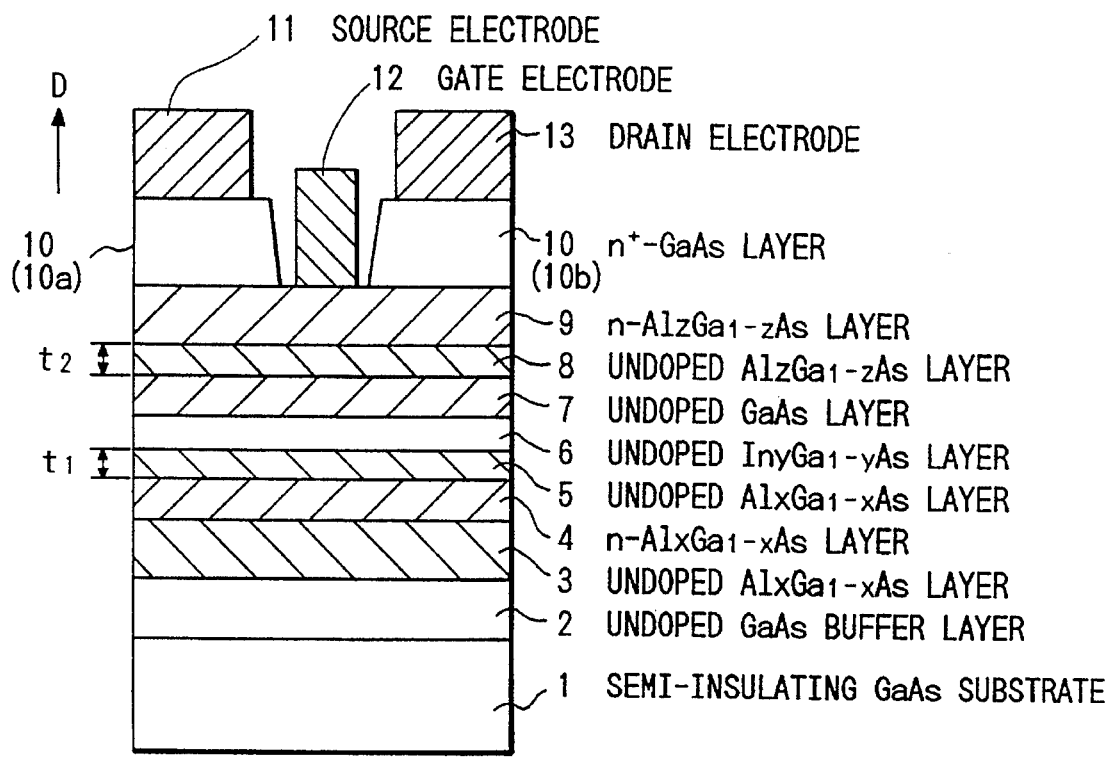
FIG. 1 is a cross-sectional view of the first to third embodiments of heterojunction FETs of this invention.

FIG. 1 is a cross-sectional view of the first embodiment of a heterojunction FET (field effect transistor) of this invention. This drawing is used throughout all embodiments of this invention. In FIG. 1, numeral 1 is a semi-insulating GaAs substrate. On the GaAs substrate, an undoped GaAs buffer layer 2 having a thickness of about 200 nm is formed. On the undoped GaAs buffer layer 2, an undoped $Al_xGa_{1-x}As$ layer 3 having a thickness of amount 100 nm is formed. On the undoped $Al_xGa_{1-x}As$ layer 3, an $Al_xGa_{1-x}As$ electron supplying layer 4 having a thickness of from 2 nm to 20 nm is formed, a density of Si being from $5\times10^{17}/cm^3$ to $3\times10^{18}/cm^3$. On the $Al_xGa_{1-x}As$ electron supplying layer 4, an undoped $Al_xGa_{1-x}As$ layer 5 having a thickness of less than 30 nm, preferably ranging from 2 nm to 5 nm is formed. On the undoped $Al_xGa_{1-x}As$ layer 5, an undoped $In_yGa_{y-1}As$ layer 6 having a thickness of about 5 to 25 nm preferably 10 nm is formed. On the undoped $In_yGa_{y-1}As$ layer 6, an undoped GaAs layer 7 having a thickness of about 5 to 25 nm, preferably 15 nm is formed. On the undoped GaAs layer 7, an undoped $Al_zGa_{1-z}As$ layer 8 having a thickness less than 30 nm, preferably ranging from 2 nm to 5 nm is formed. On the undoped $Al_zGa_{1-z}As$ layer 8, an $Al_zGa_{1-z}As$ electron supplying layer 9 having a thickness of 30 nm is formed, a density of Si being $5\times10^{17}/cm^3$ to $3\times10^{18}/cm^3$. On the $Al_zGa_{1-z}As$ electron supplying layer 9, an n+ type GaAs layer 10 doped with Si at a high density is formed. At a gate electrode formation area, a portion of the n+ type GaAs layer is removed by etching. Therefore, at a first area on the $Al_zGa_{1-z}As$ electron supplying layer 9, a first n+ type GaAs layer 10a is formed and at a second area on the $Al_zGa_{1-z}As$ electron supplying layer 9, a second n+ type GaAs layer 10b is formed other than the first area and the gate formation area. A source electrode 11 is formed on the first n+ type GaAs layer 10a. A gate electrode 12 is formed on the $Al_zGa_{1-z}As$ electron supplying layer 9 at the gate electrode formation area. A drain electrode 13 is formed on the second n+type GaAs layer 10b. The amounts of x and z in the AlGaAs layers range from 0.15 to 0.4, preferably 0.2 to 0.3 under a condition x=z. The amount of InAs y in the InGaAs layer ranges from 0.05 to 0.3, preferably 0.10 to 0.25 where a favorable crystal growth is possible and a conduction band discontinuous value is relatively large. In an experiment of this embodiment, the InAs composition y in the InGaAs layer is set to 0.20.

Figure 2:
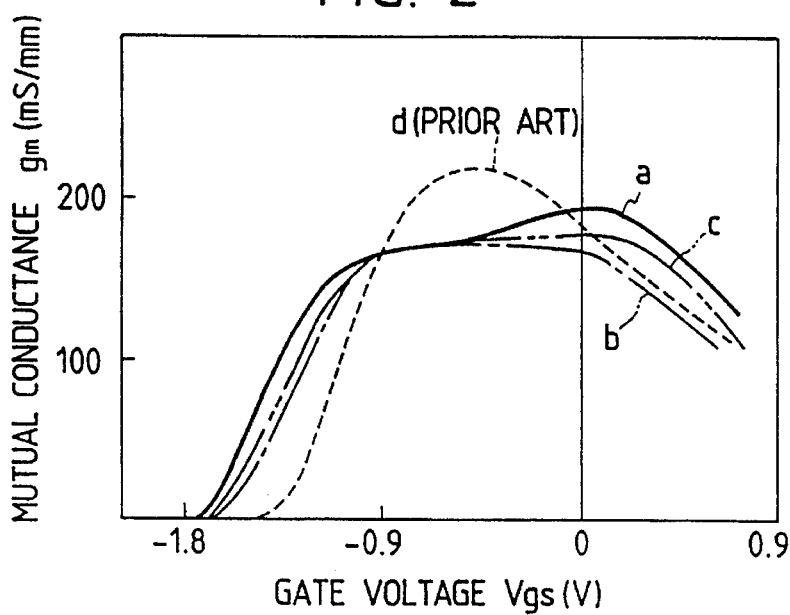
FIG. 2 shows gate voltage depending characteristics (gm-Vgs characteristic) with respect to a mutual conductance of the heterojunction FETs of this invention shown in FIG. 1 with reference to the prior art double heterojunction FET.
Figure 3:
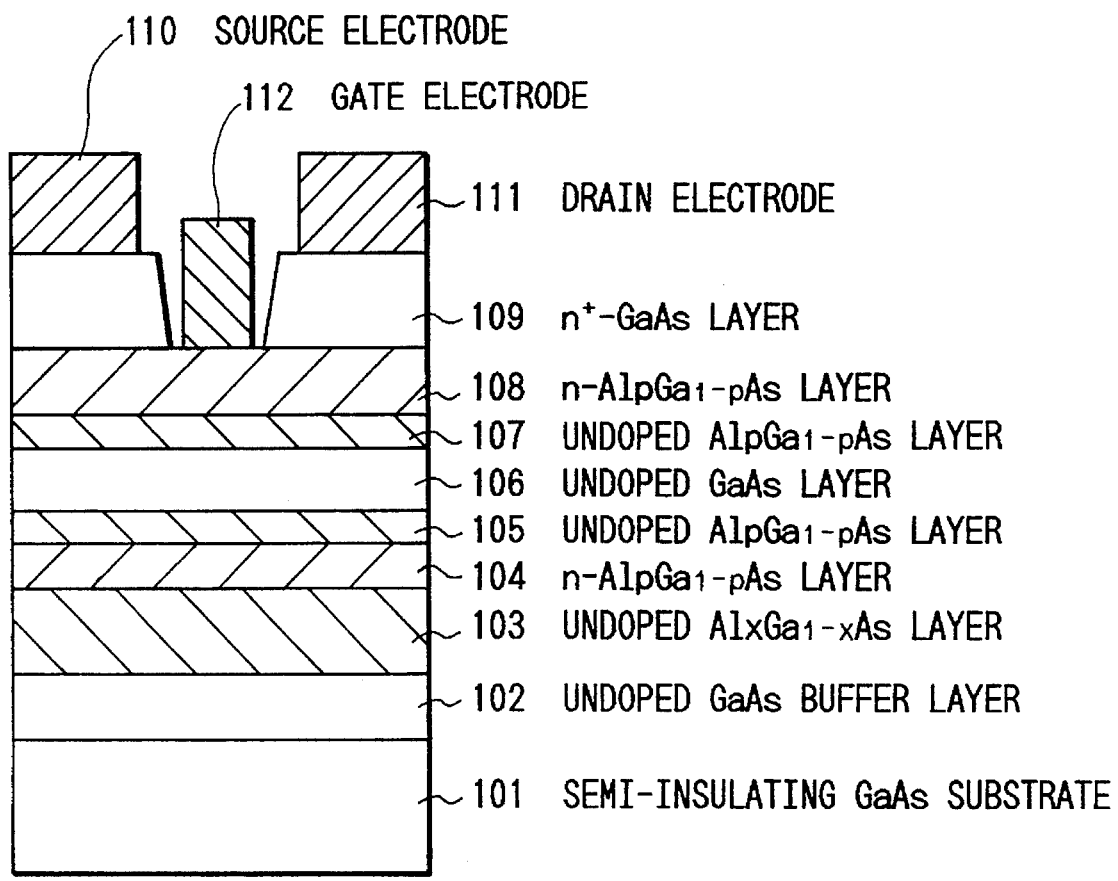
FIG. 3 is a cross-sectional view of an example of such a prior art double heterojunction FET.

FIG. 2 shows gate voltage depending characteristics (gm-Vgs characteristic) with respect to a mutual conductance of the heterojunction FETs of this invention shown in FIG. 1 with reference to the prior art double heterojunction FET mentioned earlier. Curve "a" represents the gm-Vgs characteristic of the heterojunction FET of the first embodiment of this invention. Curve "d" is a gm-Vgs characteristic of the prior art double heterojunction FET for reference. As shown in FIG. 2, the mutual conductance of the heterojunction FET of this embodiment is kept high over a wider range than that of the prior art double heterojunction FET. Moreover, there is no sharp decrease in the mutual conductance at a high gate voltage region which is shown in the prior art double heterojunction FET. Therefore, the heterojunction FET shows a more favorable distortion characteristic than the prior art double heterojunction FET mentioned earlier. Thus, it is confirmed that the second order distortion characteristic and the third order distortion characteristic are improved more than 10 dB from the measurements compared with the prior art double heterojunction FET mentioned earlier.

Hereinbelow will be described a second embodiment.

The second embodiment of this invention is made to further improve the distortion characteristic by modification of the heterojunction FET of the first embodiment. The second embodiment has substantially the same structure as the first embodiment. The difference is in the density of Si in the $Al_xGa_{1-x}As$ electron supplying layer 4. That is, in the first embodiment, the Si density of the $Al_xGa_{1-x}As$ electron supplying layer 4 has the same Si density as the $Al_xGa_{1-x}As$ electron supplying layer 9, that is, $2\times10^{18}/cm^3$. However, in this embodiment, the Si density Nd2 of the $Al_zGa_{1-z}As$ electron supplying layer 9 located on the side of electrode-provided surface is made smaller than the Si density Nd1 of the $Al_xGa_{1-x}As$ electron supplying layer 4 on the side of the semi-insulating GaAs substrate 1. For example, the Si density Nd2 is about 50% of Nd1. An experiment to make the heterojunction FET of the second embodiment was done under the condition that Nd1=$2\times10^{18}/cm^3$, Nd2=$1\times10^{18}/cm^3$, and the other conditions are the same as the first embodiment. The measurement gm-Vgs characteristic is shown by a curve "b" in FIG. 2. As shown in FIG. 2, the mutual conductance of this embodiment is high over a wider range of Vgs as similar to the first embodiment. However, an increase of the mutual conductance at the high gate voltage range which is seen in the curve "a" of the first embodiment is favorably suppressed.

This point will be discussed more specifically. If the value of the Nd2 is zero, the mutual conductance gm decreases considerably at the high gate voltage region. Therefore, in order to obtain flatness in the characteristic of the mutual conductance gm at at the high gate voltage region, it is favorable that the value of the Nd2 is set to from 30% to 70% of Nd1.

Hereinbelow will be described a third embodiment.

The third embodiment of this invention is made to further improve the distortion characteristic by modification of the heterojunction FET of the first embodiment. The third embodiment has substantially the same structure as the second embodiment. The difference is that in the AlAs composition in $Al_xGa_{1-x}As$ layers 8, 9, and 10 on the side of the electrode provided surface is made smaller than x in the AlAs composition x in the $Al_xGa_{1-x}As$ layers 3, 4, and 5. For example, an experiment to make the heterojunction FET of the third embodiment was done under the condition that x=0.3 and z=0.15, and the other conditions are the same as the second embodiment. The measurement gm-Vgs characteristic is shown by a curve "c" in FIG. 2. As shown in FIG. 2, the mutual conductance of this embodiment is high over a wider range of Vgs as similar to the first embodiment. Moreover, the increase of the mutual conductance at the high gate voltage range which is seen in the curve "a" of the first embodiment is suppressed considerably. That is, the curve "c" is drawn between the curves "a" of the first embodiment and "b" of the second embodiment at high gate voltage range.

All embodiments provide gm-Vgs characteristics wherein changes in the mutual conductance are small over a wider gate voltage range than the prior art double heterojunction FET, which is effective to the reduction of distortion in the heterojunction FET.

Here, it is favorable that a first amount of the AlAs composition of the $Al_zGa_{1-z}As$ layer 9 and a second amount of the AlAs composition of the $Al_xGa_{1-x}As$ layer 4 are set to be such that the first amount is 30% to 70% of the second amount in consideration of the flatness of the mutual conductance characteristic at the high gate voltage.

In the second and third embodiments, the reduction in the amount of electrons staying in the GaAs layers in the channel of the heterojunction FET is tried. This can be obtained also as follows:

A thickness t2 of the undoped $Al_zGa_{1-z}As$ layer 8 contacting the GaAs layer 7 is made larger than the thickness t1 of the undoped $Al_zGa_{1-z}As$ layer 5 contacting the $In_yGa_{y-1}As$ layer 6. For example, heterojunction FETs of modifications of the second and third embodiments are made under the condition that t2=10 nm, t1 is the same as the first embodiment, i.e., t1=5 nm and the other condition is the same as the first embodiment.

Here, it is favorable that the thickness t2 is set to be 1.5 times the thickness t1 in consideration of the lowering the amount of electrons in the GaAs layer of the channel mentioned in the second and third embodiments.

Moreover, this invention is described about the heterojunction FET having n-channel through which electrons flow. However, this invention is applicable to the heterojunction FET having p-channel.

Figure 4:
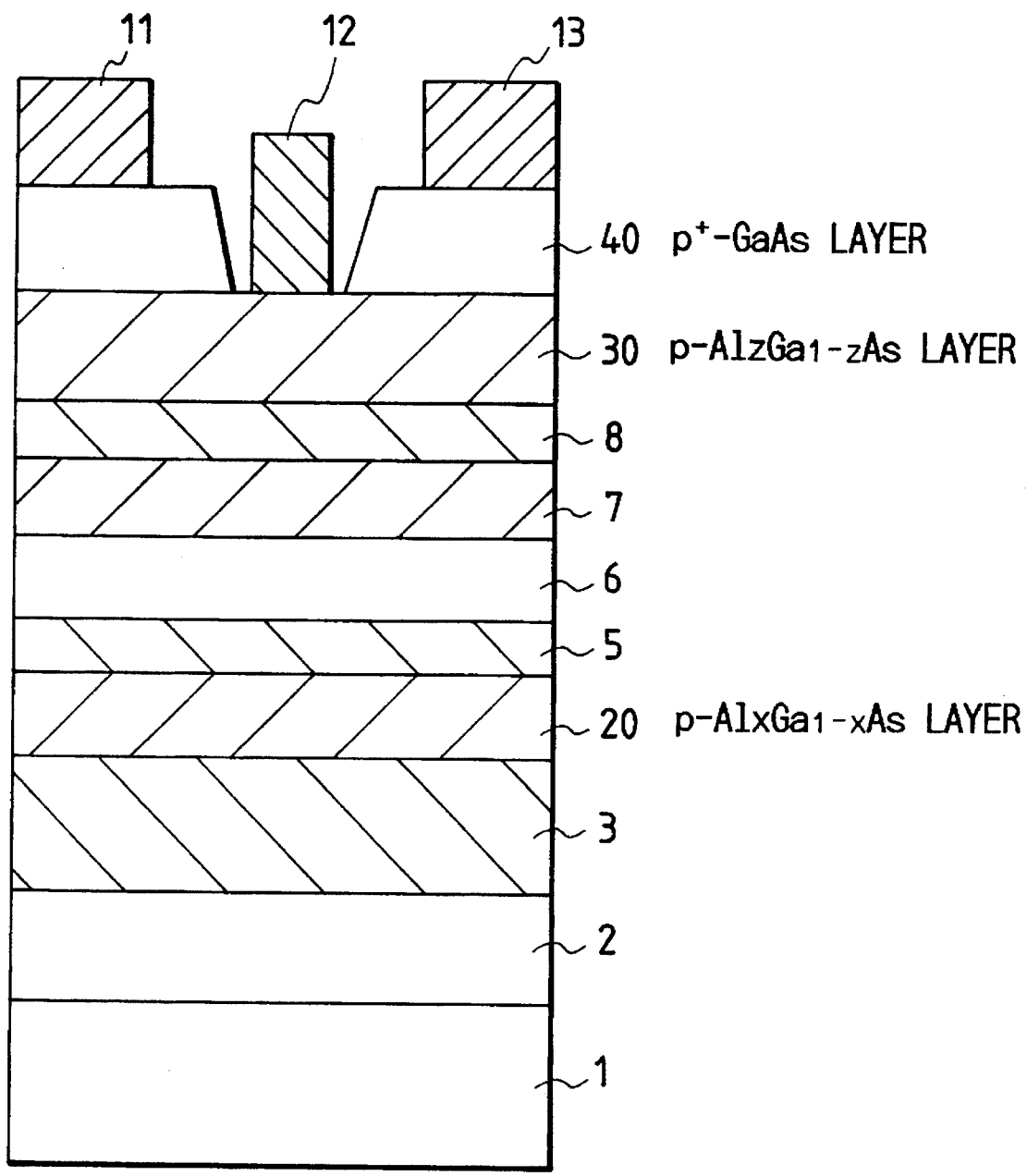
FIG. 4 is a cross-sectional view of a modification of the first embodiment of a p-type heterojunction FET of this invention.

This point will be described more specifically. FIG. 4 is a cross-sectional view of a modification of the first embodiment of a p-type heterojunction FET (field effect transistor) of this invention. However, this modification is applicable to the other embodiments of this invention.

In FIG. 4, the basic structure of this p-type heterojunction FET is similar to the first embodiment shown FIG. 1. The difference is in that the n-$Al_xGa_{1-x}As$ electron supplying layer 4 is replaced by a p-$Al_zGa_{1-z}As$ layer 20, the n-$Al_zGa_{1-z}As$ layer 9 is replaced by a p-$Al_zGa_{1-z}As$ layer 30, and the $n^+$-type GaAs layer 10 is replaced by a $p^+$-type GaAs layer 40. The values such as thickness and amounts of elements in this modification are the same as the first embodiment. The dopant of Si of the first embodiment is replaced by Be or C.

As mentioned above, the heterojunction FETs according to this invention provide the gm-Vgs characteristics wherein the mutual conductances are essentially constant over a wider gate voltage range than the prior art double heterojunction FET, so that this heterojunction FET has a favorable distortion characteristic. As a result, this heterojunction FET provides improvement in characteristics of the amplifiers used for multi-channel communication systems.

What is claimed is:

1. A heterojunction field effect transistor comprising:
   (a) a semi-insulating GaAs substrate;
   (b) a heterojunction structure formed on said semi-insulating GaAs substrate in a predetermined direction, said heterojunction structure comprising:
      (i) an active layer comprising a channel layer including an undoped InGas layer, wherein 0.05=y=0.30, and an undoped GaAs layer formed on and in contact with said undoped $In_xGa_{1-y}As$ layer in said predetermined direction; and
      (ii) first and second AlGaAs layers doped with first and second dopants, respectively, sandwiching said active layer, said second AlGaAs layer being provided between said active layer and said semi-insulating GaAs substrate;;
   (c) a source electrode structure formed on a first area of said
   (d) a gate electrode structure formed on a second area of said heterojunction structure and
   (e) a drain electrode structure formed on a third area of said heterojunction structure.

2. A heterojunction field effect transistor as claimed in claim 1, wherein $0.10 \leq y \leq 0.25$.

3. A heterojunction field effect transistor as claimed in claim 1, wherein said first and second dopants are of n-type.

4. A heterojunction field effect transistor as claimed in claim 1, wherein said first and second dopants are of p-type.

5. A heterojunction field effect transistor as claimed in claim 1, wherein a first density of said first dopant of said first AlGaAs layer is lower than a second density of said second dopant of said second AlGaAs.

6. A heterojunction field effect transistor as claimed in claim 5, wherein said first density of said first dopant is from 30% to 70% of said second density of said second dopant.

7. A heterojunction field effect transistor as claimed in claim 5, wherein a first amount of a first AlAs composition of said first AlGaAs layer is lower than a second amount of a second AlAs composition of said second AlGaAs layer.

8. A heterojunction field effect transistor as claimed in claim 7, wherein said first amount is 30% to 70% of said second amount.

9. A heterojunction field effect transistor as claimed in claim 1, wherein said source electrode structure comprises a first $n^+$type GaAs layer doped with Si at a high density and a source electrode formed on said first $n^+$type GaAs layer, and said drain electrode structure comprises a second $n^+$type GaAs layer doped with Si at a high density and a drain electrode formed on said second $n^+$type GaAs layer.

10. A heterojunction field effect transistor comprising:
    (a) a semi-insulating GaAs substrate;
    (b) a heterojunction structure formed on said semi-insulating GaAs substrate in a predetermined direction, said heterojunction structure comprising:
       (i) an active layer comprising a channel layer including an undoped $In_yGa_{1-y}As$ layer, wherein $0.05 = y \leq 0.30$, and an undoped GaAs layer formed on and in contact with said undoped $In_yGa_{1-y}As$ layer in said predetermined direction;
       (ii) first and second undoped AlGaAs layers sandwiching said active layer, said second undoped AlGaAs layer being provided between said active layer and said semi-insulating GaAs substrate; and (iii) first and second AlGaAs layers doped with first and second dopants, respectively, sandwiching said first and second undoped AlGaAs layers and said active layer, said second doped AlGaAs layer being provided between said second undoped AlGaAs layer and said semi-insulating GaAs substrate (c) a source electrode structure formed on a first area of said heterojunction structure;

(d) a gate electrode structure formed on a second area of said heterojunction structure; and (e) a drain electrode structure formed on a third area of said heterojunction structure.

11. A heterojunction field effect transistor as claimed in claim 10, wherein said first and second undoped AlGaAs layers have first and second thicknesses respectively, said first thickness being larger than said second thickness.

12. A heterojunction field effect transistor as claimed in claim 11, wherein said first thickness is 1.5 to 3.0 times the second thickness.

13. A heterojunction field effect transistor as claimed in claim 10, wherein said source electrode structure comprises a first n$^+$type GaAs layer doped with Si at a high density and a source electrode formed on said first n$^+$type GaAs layer, and said drain electrode structure comprises a second n$^+$type GaAs layer doped with Si at a high density and a drain electrode formed on said second n$^+$type GaAs layer.

14. A heterojunction field effect transistor as claimed in claim 10, wherein said first and second dopants are of n type.

15. A heterojunction field effect transistor as claimed in claim 10, wherein said first and second dopants are of p type.

16. A heterojunction field effect transistor comprising:

(a) a semi-insulating GaAs substrate;

(b) an undoped GaAs buffer layer formed on said semi-insulating GaAs substrate;

(c) a first undoped $Al_xGa_{1-x}As$ layer formed on said undoped GaAs buffer layer;

(d) an n-$Al_xGa_{1-x}As$ electron supplying layer formed on said first undoped $Al_xGa_{1-x}As$ layer;

(e) a second undoped $Al_xGa_{1-x}As$ layer formed on said $Al_xGa_{1-x}As$ electron supplying layer;

(f) a channel layer including an undoped $In_yGa_{1-y}As$ layer formed on said second undoped $Al_xGa_{1-x}As$ layer.

(g) an undoped GaAs layer formed on and in contact with said undoped $In_yGa_{1-y}As$ layer;

(h) an undoped $Al_zGa_{1-z}As$ layer formed on said undoped GaAs layer;

(i) an n-$Al_zGa_{1-z}As$ electron supplying layer formed on said undoped $Al_zGa_{1-z}As$ layer;

(j) first and second n$^+$type GaAs layers doped with Si at a high density formed on said n-$Al_zGa_{1-z}As$ electron supplying layer at first and second regions, respectively;

(k) a source electrode formed on said first n$^+$type GaAs layer;

(l) a gate electrode formed on said n-$Al_zGa_{1-z}As$ electron supplying layer; and (m) a drain electrode formed on said second n$^+$type GaAs layer.

17. A heterojunction field effect transistor as claimed in claim 16, wherein said x and z in the AlGaAs layers are equal and range from 0.15 to 0.4.

18. A heterojunction field effect transistor as claimed in claim 16 wherein, said n-$Al_xGa_{1-x}As$ electron supplying layer includes Si of a density of $5 \times 10^{17}/cm^3$ to $3 \times 10^{18}/cm^3$.

19. A heterojunction field effect transistor as claimed in claim 16 wherein, said n-$Al_zGa_{1-z}As$ electron supplying layer includes Si of a density of $5 \times 10^{17}/cm^3$ to $3 \times 10^{18}/cm^3$.

20. A heterojunction field effect transistor as claimed in claim 16, wherein a first density of dopant included in said n-$Al_zGa_{1-z}As$ electron supplying layer is lower than a second density of dopant included in said n-$Al_xGa_{1-x}As$ electron supplying layer.

21. A heterojunction field effect transistor as claimed in claim 16, wherein z<x.

22. A heterojunction field effect transistor as claimed in claim 16, wherein said undoped $Al_zGa_{1-z}As$ layer has a first thickness and said second undoped $Al_xGa_{1-x}As$ layer has a second thickness, said first thickness being larger than said second thickness.

23. A heterojunction field effect transistor as claimed in claim 22, wherein said first thickness is 1.5 to 3.0 times the second thickness.

24. A heterojunction field effect transistor as claimed in claim 20, wherein said first density is from 30% to 70% of said second density.

25. A heterojunction field effect transistor according to claim 1, wherein said source, gate and drain electrode structures are formed on the same side of the heterojunction structure.

26. A heterojunction field effect transistor according to claim 10, wherein said source, gate and drain electrode structures are formed on the same side of the heterojunction structure.

* * * * *